United States Patent [19]

Shimizu et al.

[11] 4,450,185

[45] May 22, 1984

[54] PROCESS FOR FORMING AMORPHOUS SILICON FILM

[75] Inventors: Isamu Shimizu, Yokohama; Kyosuke Ogawa; Eiichi Inoue, both of Tokyo, all of Japan

[73] Assignee: Canon Kabushiki Kaisha, Tokyo, Japan

[21] Appl. No.: 353,186

[22] Filed: Mar. 1, 1982

[30] Foreign Application Priority Data

Mar. 12, 1981 [JP] Japan ................................. 56-36266

[51] Int. Cl.$^3$ ............................................. H01L 45/00
[52] U.S. Cl. ......................................... 427/39; 427/74
[58] Field of Search .................................... 427/39, 74

[56] References Cited

U.S. PATENT DOCUMENTS 3,961,103  6/1976  Aisenberg .............................. 427/39
4,064,521  12/1977  Carlson .............................. 427/39 X Primary Examiner—James R. Hoffman
Attorney, Agent, or Firm—Fitzpatrick, Cella, Harper & Scinto

[57] ABSTRACT

A process for forming a deposition film on a substrate comprising introducing a deposition film forming material in gaseous state into a deposition chamber, the inside pressure of which is reduced, and causing an electric discharge to take place in a gaseous atmosphere of said deposition film forming material, said process comprising introducing a starting material in gaseous state for preparing said deposition film forming material into a discharge reaction chamber, causing a discharge to take place in a gaseous atmosphere of said starting material to give rise to a reaction of said starting material, and introducing the resulting reaction product into said deposition chamber through a transport means connecting said discharge reaction chamber with said deposition chamber, by which the steps including from the step of preparing said deposition film forming material to the step of forming said deposition film are effected continuously.

4 Claims, 1 Drawing Figure

PROCESS FOR FORMING AMORPHOUS SILICON FILM

BACKGROUND OF THE INVENTION

1. Field of the Invention

The present invention relates to a process for forming a deposition film. More particularly, it is concerned with such a process which is useful for forming a photoconductive film on a substrate by utilizing electric discharge including for example glow discharge.

2. Description of the Prior Art

Heretofore, for example, a photoconductive film composed of an amorphous material containing a silicon atom as the matrix is formed on a substrate by introducing a material for forming the film, in the gaseous state, into a deposition chamber which is reduced in the inside pressure, causing a glow discharge to take place and utilizing the plasma phenomenon. In this case, particularly when a photoconductive film having desired properties and a larger area is to be obtained, it is very difficult to increase the film forming speed while attempting to achieve uniformity in the film thickness, physical properties such as electrical, optical and photoelectrical properties and film quality over the whole area, as compared with the usual vacuum vapor deposition.

For example, a gaseous material such as $SiH_4$, $Si_2H_6$, $SiF_4$, combination of $SiH_4$ and $SiF_4$, or the like is decomposed by using energy of electric discharge to form a film of amorphous silicon containing at least one of hydrogen atom and halogen atom (X), on a substrate. The amorphous silicon will be hereinafter called simply "a-Si(H,X)". When the electrical porperty of the film obtained by the above-mentioned method is to be utilized, in order to attain uniformity in the electrical property of the film over the whole area and improvement in the film quality over the whole area, it is necessary to decrease the film deposition rate and increase the temperature of the substrate since the electrical property of the film depends largely upon the film deposition rate and the substrate temperature, during formation of the film.

On the other hand, for the purpose of improving the producibility and mass-producibility, it is considered to increase the discharge power and flow amount of the gas to increase the film deposition rate. However, when the discharge power and/or flow amount of the gas are increased, the resulting film shows remarkable tendency to deteriorate in the electrical, optical and photoelectrical properties and increase dependence of the properties upon the area of the film. Therefore, in practice, it is very difficult to form a film of excellent quality. In order to realize the industrial application of preparing a photoconductive member having a photoconductive film composed of an amorphous material containing a silicon atom as the matrix, it is necessary to enhance the quality of film deeply related to the photosensitivity, repetition use characteristic and use environmental characteristic and improve the producibility and mass-producibility of the film as well as reproducibility while retaining uniform or even properties of the film.

SUMMARY OF THE INVENTION

It is a primary object of the present invention to provide a process for forming a deposition film which is remarkably excellent in terms of the productivity and mass-productivity and is able to provide easily a photoconductive film having superior electrical, optical and photoelectric properties and film quality over the large area and being excellent in the bulk closeness and filling property.

It is another object of the present invention to provide a process for preparing a photoconductive member which is able to provide a film having substantial uniformity in the physical properties and thickness over the whole area of the film even when the film is of large surface area and exhibiting superior use environmental characteristics including photoconductive and electrical characteristics at high temperature and humidity, with good reproducibility and high efficiency, at high speed, and economically.

According to the present invention, there is provided a process for forming a deposition film on a substrate for formation of the deposition film comprising introducing a deposition film forming material in gaseous state into a deposition chamber, the inside pressure of which is reduced, and causing an electric discharge to take place in a gaseous atmosphere of said deposition film forming material, said process comprising introducing a starting material in gaseous state for preparing said deposition film forming material into a discharge reaction chamber, causing a discharge to take place in a gaseous atmosphere of said starting material to give rise to a reaction of said starting material, and introducing the resulting reaction product into said deposition chamber through a transport means connecting said discharge reaction chamber with said deposition chamber, by which the steps including from the step of preparing said deposition film forming material to the step of forming said deposition film are effected continuously.

BRIEF DESCRIPTION OF THE DRAWING

In the drawing, the single FIGURE is a schematic view of an apparatus for embodying the present invention.

DETAILED DESCRIPTION OF THE PREFERRED EMBODIMENTS

Figure 1:
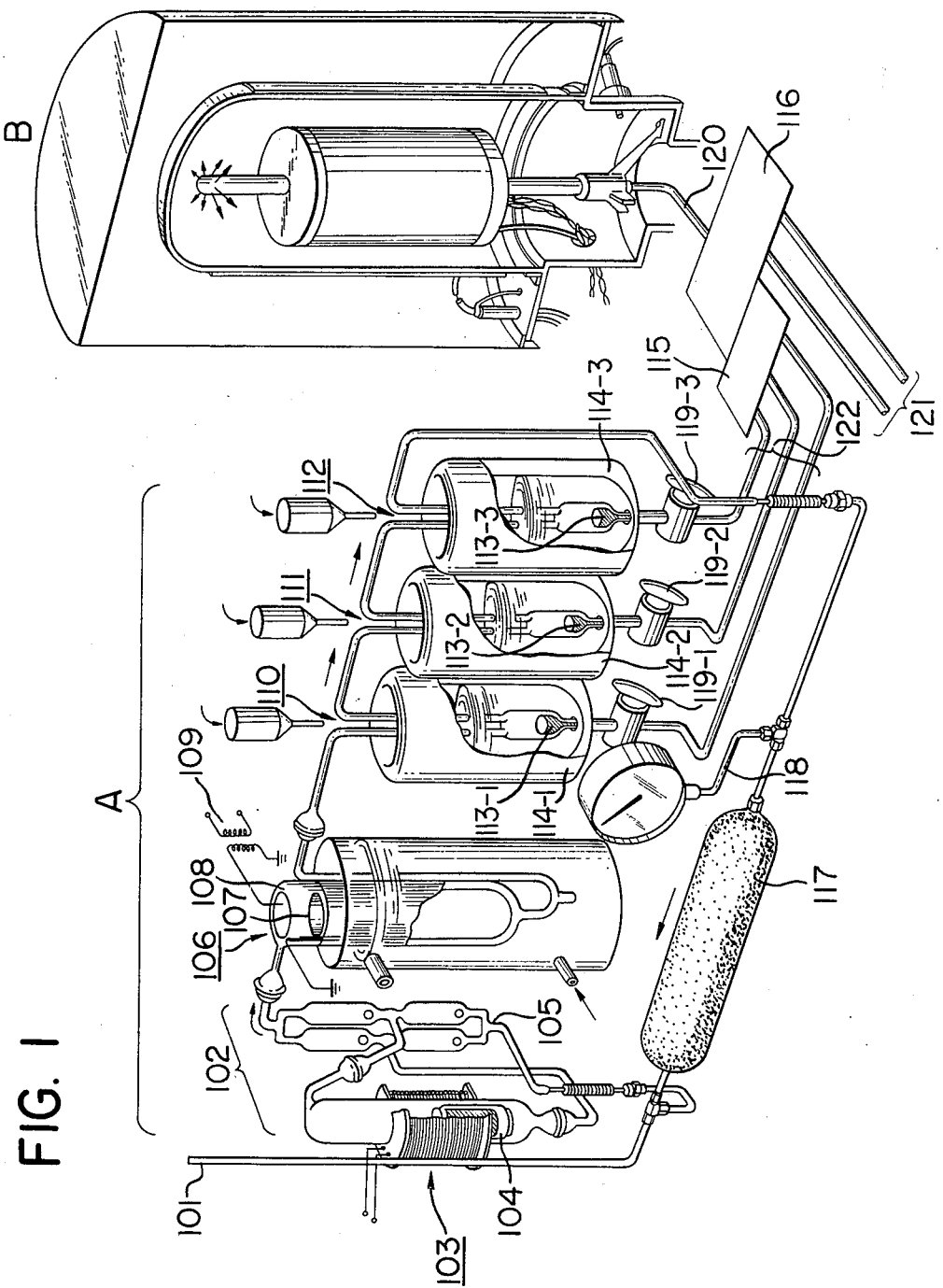

The present invention will be explained in detail with reference to the single drawing. The following explanation is restricted to formation of a photoconductive film composed of a-Si(H,X) using the apparatus as shown in FIG. 1. However, it should be noted that the present invention is not restricted to formation of such photoconductive film but is applicable to formation of various deposition films.

FIG. 1 shows schematically an airtight apparatus for forming an a-Si(H,X) film and preparing continuously a material for forming the film. The apparatus may be divided generally into two functioning sections which are designated by "A" and "B" in the drawing. Section "A" corresponds to that for synthesizing the material for forming the film, and section "B" to that for forming an a-Si(H,X) film. The synthesizing section A includes a pipe 101 for introducing a gas of a starting material such as for example $SiH_4$, $SiF_4$ and $SiCl_4$ for preparing the film forming material from the outside and for exhausting the residual gas. The pipe 101 is connected with a gas bomb (not shown) for the starting material and with an exhausting system (not shown) through a stop valve (not shown). Numeral 102 denotes a pump and its attachments for allowing the gas to circulate within the apparatus system after the stop valve is closed to make the apparatus system independent from the exhausting system. Numeral 103 designates an electromagnet which operates in accordance with the signal from the outside switching and relay units and causes a glass float 104 with a built-in iron piece to go up and down so that the transport of the gas is possible. Numeral 105 indicates a rectifying unit for smoothing the flow of the gas. The gaseous starting material is transported to an ozonizer type synthesizing tube 106 through the rectifying unit 105. The ozonizer type synthesizing tube 106 comprises closed, coaxial double cylindrical tubes made of hard glass and capacitor type electrodes. The gaseous starting material is allowed to flow in the gap of several millimeters between the double tubes. At that time, an electric discharge, for example silent discharge is brought about by electric field applied between the electrodes 107 and 108 so that the gas is made into an oligomer or mixture thereof. Both of the inside and outside electrodes 107 and 108 are retained in the cooling water in order to prevent the rise in the temperature attributable to the dielectric loss of the dielectric material and to make the electric field uniform.

Numeral 109 denotes a neon transformer for transforming a primary voltage of for example 50 Hz, 100 V to a voltage of several kilovolts necessary for occurrence of an electric discharge. The terminals of the secondary winding side are connected with the electrodes 107 and 108, respectively. The gas mixture of the starting material made into an oligomer or mixture thereof is allowed to pass through low temperature traps 110, 111 and 112. At that time, the gas mixture is subjected to fractional condensation by utilizing difference in the boiling points. Adiabatic containers 114-1, 114-2 and 114-3 accommodate therein refrigerants having temperatures according to the boiling points of the synthesized gases as the mixture. When these containers are arranged with respect to the flowing direction of the gas mixture so as to trap first the gas having the highest boiling point, the high purity reaction products having different molecular weights are fractionated from the mixture by the traps 110, 111 and 112, respectively. The reaction products thus liquefied are then transported through airtight type stoppers 119-1, 119-2 and 119-3 connected with the bottoms of the traps 110, 111 and 112, to a pressure adjuster 115 accommodating therein a gasifying unit. In a massflowmeter 116, the reaction products are mixed, if necessary, with another gas introduced through a pipe 121 and then transported to the apparatus B for forming a film of a-Si (H,X) through a pipe 120. The volatile component which is not liquefied by the low temperature traps is repeatedly circulated through the processes as described above by the pump 102. Numeral 117 denotes a tank for controlling the total volume within the apparatus system to a predetermined value, and 118 a pressure gauge for monitoring the proceeding state of the reaction.

As described above, the starting material is made into an oligomer or a mixture thereof by the electric discharge. The term "oligomer" as herein used means a low molecular weight polymer which contains at least two monomer units of the starting material and is gasified easily under the operation condition. The oligomer may include, for example, a compound of $Si_nH_{2n+2}$ wherein n is an integer of 2 through 12, and more preferably 2 through 8 when $SiH_4$ is used as the starting material.

Next, explanation will be made with respect to formation of a deposition film using an apparatus as shown in FIG. 1. The starting material for preparing the film forming material is first introduced into the synthesizing system A for obtaining the film forming material through the pipe 101. The starting material may include, for example $SiH_4$, $SiF_4$ and $SiCl_4$.

In the synthesizing system A, the starting material undergoes an electric discharge in the synthesizing vessel 106 to give rise to a chemical reaction. As a result, the film forming material is produced which is composed of various oligomers (for example, compound of $Si_nH_{2n+2}$ wherein n is an integer of 2 through 12, or mixture of the compounds in case of using $SiH_4$ as the starting material) having different polymerization degrees. The oligomers thus produced are transported from the synthesizing vessel 106 to the low temperature traps 110, 111 and 112 so that they are trapped by the traps and fractionated in accordance with the respective molecular weights.

The film forming materials fractionated by the traps 110, 111 and 112 are introduced through the pipes 122 into the gasifying unit 115 where the materials are gasified. The materials are mixed with another gas if desired, and then introduced into the deposition film forming system B.

The gaseous material for forming a deposition film thus introduced into the system B is given an electric discharge, for example glow discharge, so that it undergoes a discharge decomposition reaction. As a result, for example a photoconductive film of a-Si(H,X) is formed on a predetermined support.

The invention will be understood more readily with reference to the following example. However, the example is intended to illustrate the invention and is not to be construed to limit the scope of the invention.

EXAMPLE

The material for forming a film was synthesized under the conditions:

| Starting material gas | $SiH_4$ | 0.3 atm |
| Atmosphere gas | Ar | 0.7 atm |
| Discharge voltage | | 3.6 KV |
| Discharge current | | 20 mA |
| Pumping rate | | 500 cc/min |

The conditions for refrigerants in the low temperature traps and formation of a-Si:H film were as shown in Table 1. Under those conditions, film samples 1–5 were formed. The characteristics of each sample were measured, the results of which are shown also in Table 1.

As understood from the results in Table 1, each sample exhibited extremely good characteristics and film quality.

TABLE 1

| | | | Sample No. | | | | |
| --- | --- | --- | --- | --- | --- | --- | --- |
| | | | 1 | 2 | 3 | 4 | 5 |
| Low temperature trap No. Refrigerant | 110 (dry ice acetone slush) (~ −75° C.) | *Parts of oligomer in | No trap is used | No trap is used | No trap is used | No trap is used | 10 |
| | 111 (liquid nitrogen | | No | 10 | 50 | 100 | 90 |

TABLE 1-continued

| | | Sample No. 1 | 2 | 3 | 4 | 5 |
|---|---|---|---|---|---|---|
| | toluene slush) trap (~ −95° C.) | trap is used | | | | |
| | 112 (liquid nitrogen n-pentane slush) (~ −130° C.) | 100 | 90 | 50 | No trap is used | No trap is used |
| Conditions for formation of film | Ar, atmosphere gas, *parts | — | — | 100 | 200 | 200 |
| | RF power (W/cm$^2$) | 3 | Same as left | 1.5 | Same as left | Same as left |
| | Substrate temp. (°C.) | 350 | Same as left | Same as left | Same as left | Same as left |
| | Reaction pressure (torr) | 0.3 | Same as left | Same as left | 0.2 | Same as left |
| | Total flow amount (SCCM) | 90 | Same as left | 30 | 15 | Same as left |
| | Deposition rate (Å/sec) | 120 | 135 | 100 | 95 | 105 |
| Characteristics of film | $\sigma$ dark (v cm$^{-1}$) | ~10$^{-12}$ | Same as left | Same as left | Same as left | Same as left |
| | $\sigma$ photo (v cm$^{-1}$) (600 nm, 50 μW/cm$^2$) | ~10$^{-8}$ | Same as left | Same as left | Same as left | Same as left |
| | $\eta\mu\tau$ (cm$^2$/V) | ~10$^{-6}$ | Same as left | Same as left | Same as left | Same as left |
| | $E_g^{opt}$ (eV) | ~1.7 | Same as left | Same as left | Same as left | Same as left |

*Parts by volume
$\sigma$ dark: Conductivity in the dark portion
$\sigma$ photo: Photoconductivity in the light portion
$\eta\mu\tau$: Product of quantum yield, mobility (cm$^2$/V, sec) and life time (sec)
$E_g^{opt}$: Optical energy gap As described in detail, the deposition film forming method of the present invention can provide easily a film which is excellent in the physical, optical and photoelectric properties, with high efficiency and at high speed as compared with the conventional method. In addition, the present invention is able to form a film having uniformity in the above-mentioned properties and thickness over the whole region of the film and having a large surface area.

Further, in the present invention, preparation of the material for forming a film is effected by the chemical reaction caused by the electric discharge, and a series of the steps including from the step of preparing the film forming material to the step of forming a deposition film utilizing the discharge chemical reaction is conducted continuously in the airtight system. Therefore, the resulting deposition film is uniform or even in the quality over the whole area of the film. When a photoconductive film is to be formed, a film having superior electrical and photoelectrical properties can be easily obtained with high efficiency and at high speed. Particularly, when the photoconductive member obtained by the present invention is applied to the electrophotography, its superior properties can be utilized to the maximum.

What we claim is:

1. Process for providing a source of gaseous film-forming material capable of forming on a substrate in a deposition chamber, a substantially uniform film over a broad substrate surface area having enhanced photoconductive properties which comprises continuously:
   (a) introducing a gaseous source containing silicon into a discharge reaction chamber;
   (b) causing a discharge in said chamber in the presence of said gaseous atmosphere sufficient to form a gaseous reaction product having silicon oligomers;
   (c) fractionating said gaseous reaction product to separate and collect a gaseous, film-forming material comprising silicon oligomers;
   (d) introducing said gaseous film forming material into said deposition chamber and;
   (e) forming a film from said gaseous film-forming material in said deposition chamber.

2. A process for forming a film according to claim 1, in which said starting material is SiH$_4$.

3. A process for forming a film according to claim 1, in which said starting material is SiF$_4$.

4. A process for forming a film according to claim 1, in which said starting material is SiCl$_4$.

* * * * *